(12) United States Patent
Do et al.

(10) Patent No.: US 8,421,197 B2
(45) Date of Patent: Apr. 16, 2013

(54) INTEGRATED CIRCUIT PACKAGE SYSTEM WITH WARP-FREE CHIP

(75) Inventors: Byung Tai Do, Singapore (SG); Il Kwon Shim, Singapore (SG); Antonio B. Dimaano, Jr., Singapore (SG); Heap Hoe Kuan, Singapore (SG)

(73) Assignee: STATS ChipPAC Ltd., Singapore (SG)

( * ) Notice: Subject to any disclaimer, the term of this patent is extended or adjusted under 35 U.S.C. 154(b) by 156 days.

(21) Appl. No.: 13/023,244

(22) Filed: Feb. 8, 2011

(65) Prior Publication Data

US 2011/0121466 A1 May 26, 2011

Related U.S. Application Data

(62) Division of application No. 11/858,554, filed on Sep. 20, 2007, now Pat. No. 7,892,894.

(51) Int. Cl.
*H01L 23/48* (2006.01)
*H01L 23/50* (2006.01)
*H01L 23/49* (2006.01)
*H01L 23/495* (2006.01)

(52) U.S. Cl.
USPC ............ 257/669; 257/E23.003; 257/E23.079; 257/E23.136

(58) Field of Classification Search ................... 257/669, 257/E23.003, E23.079, E23.136
See application file for complete search history.

(56) References Cited

U.S. PATENT DOCUMENTS

| | | | |
|---|---|---|---|
| 4,772,935 A * | 9/1988 | Lawler et al. ................. | 257/751 |
| 5,528,076 A * | 6/1996 | Pavio ............................ | 257/666 |
| 5,536,970 A | 7/1996 | Higashi et al. | |
| 5,796,159 A | 8/1998 | Kierse | |
| 5,929,514 A | 7/1999 | Yalamanchili | |
| 5,986,335 A | 11/1999 | Amagai | |
| 6,168,975 B1 | 1/2001 | Zhang et al. | |
| 6,225,683 B1 | 5/2001 | Yalamanchili et al. | |
| 6,359,221 B1 | 3/2002 | Yamada et al. | |
| 6,396,131 B1 * | 5/2002 | Kinsman et al. ............. | 257/669 |
| 6,551,862 B2 * | 4/2003 | Oota et al. .................... | 438/118 |
| 6,635,954 B2 * | 10/2003 | Kinsman et al. ............. | 257/669 |
| 6,943,061 B1 | 9/2005 | Sirinorakul et al. | |
| 7,064,420 B2 * | 6/2006 | Han et al. ...................... | 257/669 |
| 7,129,569 B2 * | 10/2006 | Punzalan et al. ............. | 257/676 |
| 7,161,232 B1 | 1/2007 | Lee et al. | |
| 2001/0013639 A1 | 8/2001 | Abe | |
| 2002/0050642 A1 | 5/2002 | Oota et al. | |

\* cited by examiner

*Primary Examiner* — Evan Pert
(74) *Attorney, Agent, or Firm* — Ishimaru & Associates LLP

(57) ABSTRACT

An integrated circuit package system includes: a semiconductor chip; a stress-relieving layer on the semiconductor chip; an adhesion layer on the stress relieving layer; and electrical interconnects bonded to the adhesion layer.

10 Claims, 4 Drawing Sheets

INTEGRATED CIRCUIT PACKAGE SYSTEM WITH WARP-FREE CHIP

CROSS-REFERENCE TO RELATED APPLICATION(S)

This is a divisional of U.S. patent application Ser. No. 11/858,554 filed Sep. 20, 2007, now U.S. Pat. No. 7,892,894.

TECHNICAL FIELD

The present invention relates generally to integrated circuit package systems, and more particularly to a system for integrated circuit package systems with chips on leadfingers.

BACKGROUND ART

Increased miniaturization of components, greater packaging density of integrated circuits ("ICs"), higher performance, and lower cost are ongoing goals of the computer industry. As new generations of IC products are released, the number of devices used to fabricate them tends to decrease due to advances in technology. Simultaneously, the functionality of these products increases. Modern consumer electronics, particularly personal portable devices, such as cellular phones, digital cameras, memory cards, MP3 players and other personal music players (PMP), require increasing functions to fit an ever-shrinking physical space.

Semiconductor package structures continue to advance toward miniaturization and thinning to increase the density of the components that are packaged therein while decreasing the sizes of the products that are made therefrom. This is in response to continually increasing demands on information and communication apparatus for ever-reduced sizes, thicknesses, and costs, along with ever-increasing performance.

These increasing requirements for miniaturization are particularly noteworthy, for example, in portable information and communication devices such as cell phones, hands-free cell phone headsets, personal data assistants ("PDA's"), camcorders, notebook personal computers, and so forth. All of these devices continue to be made smaller and thinner to improve their portability. Accordingly, large-scale integrated circuit ("LSI") packages that are incorporated into these devices are required to be made smaller and thinner, and the package configurations that house and protect them are required to be made smaller and thinner as well.

Many conventional semiconductor die (or "chip") packages are of the type where a semiconductor chip is molded into a package with a resin, such as an epoxy molding compound. The packages have a leadframe with leads that are projected from the package body, to provide a path for signal transfer between the chip and external devices. Other conventional package configurations have contact terminals or pads formed directly on the surface of the package.

Such a conventional semiconductor package is fabricated through the following processes: a die-bonding process (mounting the semiconductor chip onto a leadframe), a wire-bonding process (electrically connecting the semiconductor chip to leadfingers of the leadframe), a molding process (encapsulating a predetermined portion of the assembly containing the chip and leadframe with an epoxy resin to form a package body), and a trimming process (completing each assembly as individual, independent packages).

The semiconductor packages, thus manufactured, are then mounted by matching and soldering the external leads or contact pads thereof to a matching pattern on a circuit board, to thereby enable power and signal input/output ("I/O") operations between the semiconductor devices in the packages and the circuit board.

An exemplary semiconductor package well known in the electronics industry is the ball-grid array ("BGA"). BGA packages typically comprise a substrate, such as a printed circuit board ("PCB"), with a semiconductor die having a multitude of bond pads mounted to the top side of the substrate. Wire bonds electrically connect the bond pads to a series of metal traces on the top side of the PCB. This series of metal traces is connected to a second series of metal traces on the backside of the PCB through a series of vias located around the outer periphery of the PCB. The second series of metal traces each terminates with a contact pad where a conductive solder ball is attached. Typically, the semiconductor die and the wire bonds are encapsulated within a molding compound.

Still thinner, smaller, and lighter package designs and mounting/connecting configurations have been adopted in response to continuing requirements for further miniaturization. At the same time, users are demanding semiconductor packages that are more reliable under increasingly severe operating conditions.

In one solution, an adhesion layer was applied on the wafer level instead of to the individual chip so as to improve productivity and reduce manufacturing costs. The adhesion layer was partially cured so it could be used to attach the chip onto the leadfingers.

As the demand for semiconductor devices with increased miniaturization and greater packaging density increased, it became desirable to thin the semiconductor wafer to a thickness of less than 250 microns (approximately 10 mils). Unfortunately, having such wafer thicknesses posed a challenge to the packaging process.

Upon partially curing the adhesion layer, wafer warpage or bowing would occur because of co-efficient of thermal expansion (CTE) mismatch between the silicon of the wafer and the material of the adhesion layer. This warping would cause problems because the wafer would not lie flat for taping, dicing, and/or die attaching.

Thus, a need still remains for an integrated circuit package system with lower costs, and with higher performance, increased miniaturization, and greater packaging densities, to provide and support systems that are capable of achieving optimal thin, high-density footprint semiconductor systems. In view of the ever-increasing commercial competitive pressures, along with growing consumer expectations and the diminishing opportunities for meaningful product differentiation in the marketplace, it is critical that answers be found for these problems. Additionally, the need to save costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit package system including: a semiconductor chip; a stress-relieving layer on the semiconductor chip; an adhesion layer on the stress relieving layer; and electrical interconnects bonded to the adhesion layer.

Certain embodiments of the invention have other aspects in addition to or in place of those mentioned above. The aspects

BEST MODE FOR CARRYING OUT THE INVENTION

Figure 1:
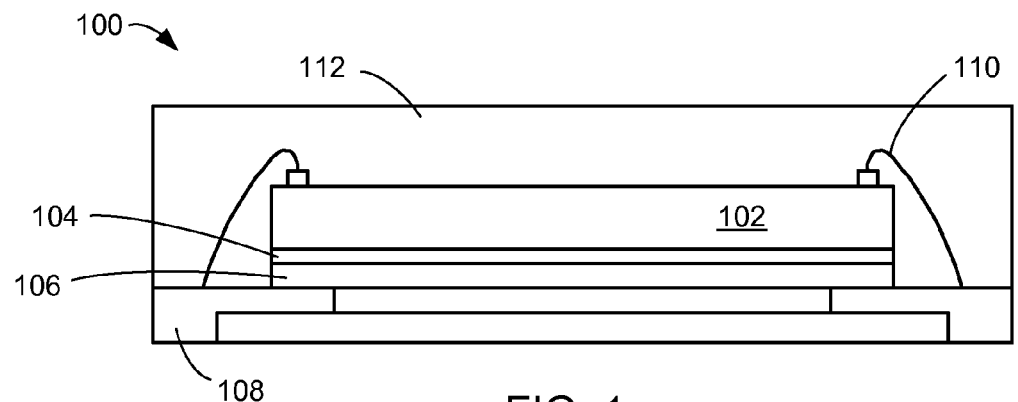
FIG. 1 is a cross-sectional view of an integrated circuit package system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

Likewise, the drawings showing embodiments of the system are semi-diagrammatic and not to scale and, particularly, some of the dimensions are for the clarity of presentation and are shown greatly exaggerated in the drawing FIGs. Where multiple embodiments are disclosed and described, having some features in common, for clarity and ease of illustration, description, and comprehension thereof, similar and like features one to another will ordinarily be described with like reference numerals. The numeration of the embodiments has been done strictly as a matter of descriptive convenience and has no other significance.

For expository purposes, the term "horizontal" as used herein is defined as a plane parallel to the plane or bottom surface of the leadfingers, regardless of their orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane.

The term "on" as used herein means and refers to direct contact among elements. The term "processing" as used herein includes deposition of material, patterning, exposure, development, etching, cleaning, and/or removal of the material or trimming as required in forming a described structure. The term "system" as used herein means and refers to the method and to the apparatus of the present invention in accordance with the context in which the term is used.

Referring now to FIG. 1, therein is shown a cross-sectional view of an integrated circuit package system 100 in a first embodiment of the present invention. The integrated circuit package system 100 includes one or more integrated circuit (IC) die or chips, such as a semiconductor chip 102.

Under the semiconductor chip 102 is a stress-relieving layer 104 and an adhesion layer 106.

It has been discovered that by having the stress-relieving layer 104 with a low modulus of elasticity (modulus) and the adhesion layer 106 with a high modulus, warping of the semiconductor chip 102 during curing processes can be minimized or eliminated. Generally, a "high modulus" layer is defined as a higher modulus as compared to a "low modulus" layer where the modulus of the high modulus layer is about ten times the modulus of the low modulus layer.

The stress-relieving layer 104 in one embodiment has a low modulus in a range of less than 100 MPa and the adhesion layer 106 has a high modulus in a range of more than 1 GPa.

The stress-relieving layer 104 and the adhesion layer 106 may be applied as films, tapes, or coatings, and can be partially or fully cured. The stress-relieving layer 104 and the adhesion layer 106 also have adhesive properties and bond with each other as well as being capable of bonding the semiconductor chip 102 to electrical interconnects, such as leadfingers 108.

The semiconductor chip 102 is electrically connected to the leadfingers 108 by bond wires 110 and is encapsulated in an encapsulant 112.

Figure 2:
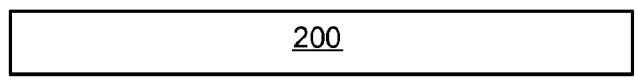
FIG. 2 is a cross-sectional view of a wafer in an intermediate stage of manufacture in accordance with the first embodiment of the present invention.

Referring now to FIG. 2, therein is shown a cross-sectional view of a wafer 200 in an intermediate stage of manufacture in accordance with the first embodiment of the present invention. The wafer 200 is generally of silicon or other semiconductor material and has integrated circuits (not shown) manufactured on and in the material.

Figure 3:
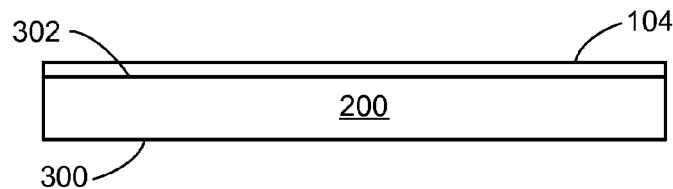
FIG. 3 is the structure of FIG. 2 after forming a stress-relieving layer thereon.

Referring now to FIG. 3, therein is shown the structure of FIG. 2 after forming the stress-relieving layer 104 thereon. The wafer 200 has an active side 300 and a backside 302. The stress-relieving layer 104 has been formed on the backside 302 by a process, such as rolling or pressing for tape or film, spin coating, spraying, or screen-printing for a coating.

Figure 4:
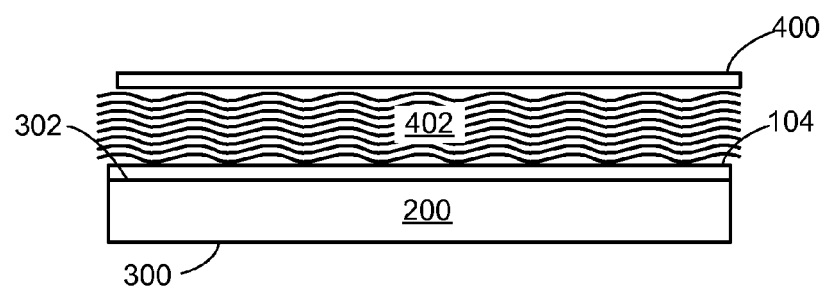
FIG. 4 is the structure of FIG. 3 during partial or full curing of the stress-relieving layer.

Referring now to FIG. 4, therein is shown the structure of FIG. 3 during partial or full curing of the stress-relieving layer 104. A heat or light (e.g., ultra-violet) source 400 applies heat or light 402 for the partial or full curing. It will be understood that some stress-relieving materials may be self-curing without the application of heat or light.

Figure 5:
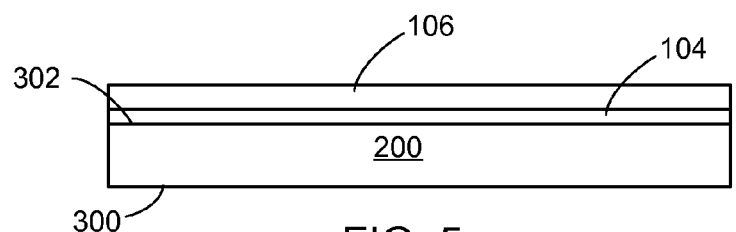
FIG. 5 is the structure of FIG. 4 after forming an adhesion layer thereon.

Referring now to FIG. 5, therein is shown the structure of FIG. 4 after forming the adhesion layer 106 thereon. The adhesion layer 106 may be formed by rolling or pressing for a tape or a film, and spin coating, spraying, or screen printing for a coating.

Figure 6:
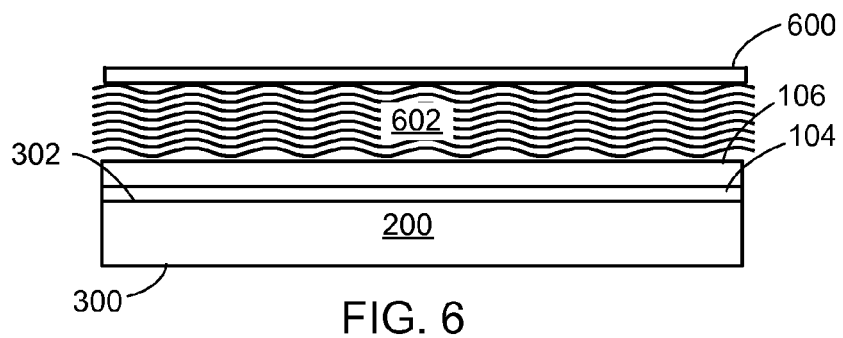
FIG. 6 is the structure of FIG. 5 during partial or full curing of the adhesion layer.

Referring now to FIG. 6, therein is shown the structure of FIG. 5 during partial or full curing of the adhesion layer 106. A heat or light source 600 applies heat or light 602 for the partial or full curing of the adhesion layer 106. It will be understood that some adhesion materials are self-curing without the application of the heat or light 602.

Figure 7:
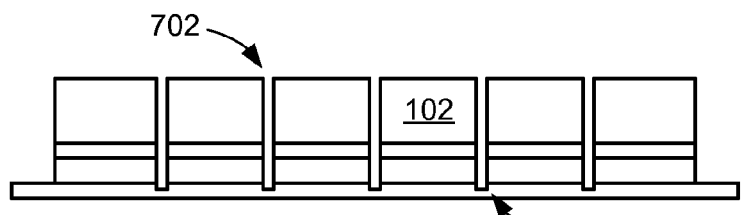
FIG. 7 is the structure of FIG. 6 after mounting and dicing the wafer and forming individual semiconductor chips.

Referring now to FIG. 7, therein is shown the structure of FIG. 6 after mounting and dicing the wafer 200 and forming individual semiconductor chips 102. The wafer 200 with the stress-relieving layer 104 and the adhesion layer 106 has been mounted on a dicing tape 700 and the structure has been diced along lines 702 to form the semiconductor chips 102.

Figure 8:
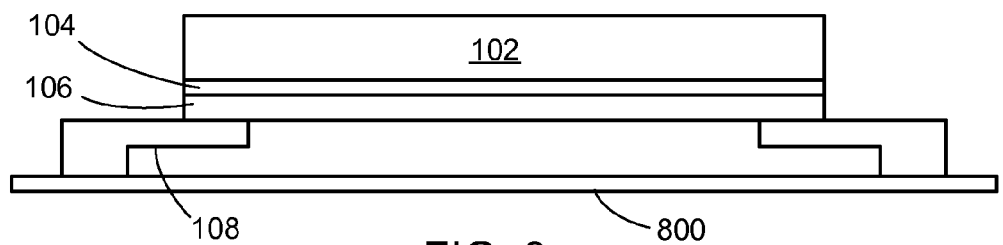
FIG. 8 is a view of the semiconductor chip after die attach.

Referring now to FIG. 8, therein is shown the semiconductor chip 102 after die attach. The semiconductor chip 102 is on the stress-relieving layer 104, which is on the adhesion layer 106. The adhesion layer 106 is die attached to the leadfingers 108 so the semiconductor chip 102 is positioned between and over the leadfingers 108. Generally, at this point, the leadfingers 108 are still part of a leadframe (not shown), which is mounted on an optional leadframe tape 800.

Figure 9:
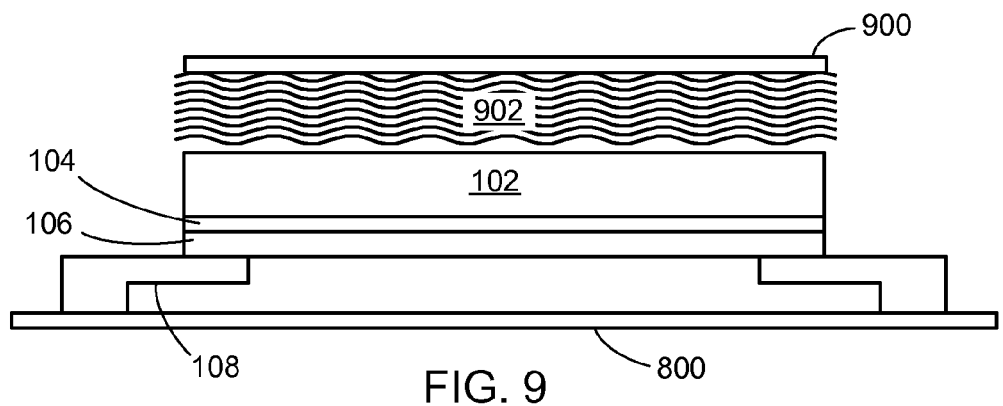
FIG. 9 is the structure of FIG. 8 during completion of curing of the stress-relieving layer and the adhesion layer.

Referring now to FIG. 9, therein is shown the structure of FIG. 8 during the complete cure of the stress-relieving layer 104 and the adhesion layer 106. A heat or light source 900 applies heat or light 902 for the complete cure. It will be understood that this complete cure is optional and is only used where partial cures were used in previous processing.

Figure 10:
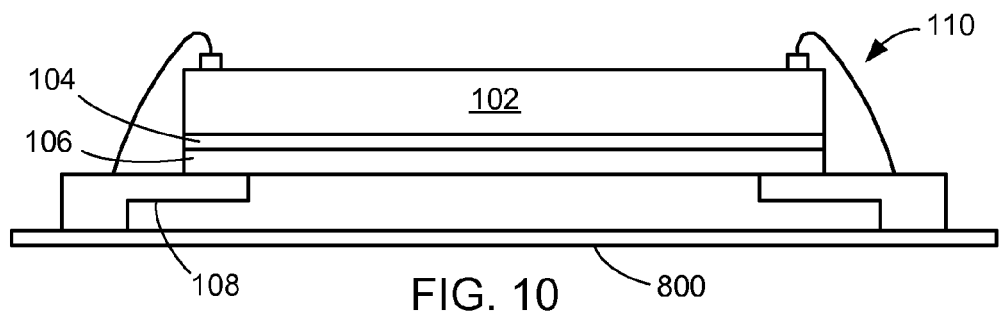
FIG. 10 is the structure of FIG. 9 after wire bonding bond wires between the semiconductor chip and the leadfingers.

Referring now to FIG. 10, therein is shown the structure of FIG. 9 after wire bonding of the bond wires 110 between the semiconductor chip 102 and the leadfingers 108.

Figure 11:
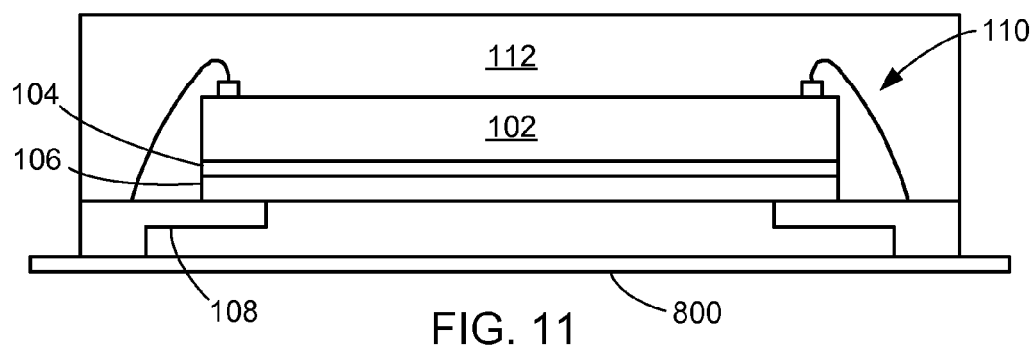
FIG. 11 is the structure of FIG. 10 after encapsulation.

Referring now to FIG. 11, therein is shown the structure of FIG. 10 after encapsulation. The encapsulant 112 encapsulates the semiconductor chip 102, the stress-relieving layer 104, the adhesion layer 106, the leadfingers 108, and the bond wires 110.

It should be noted that as an option the completion of the cure of the stress-relieving layer 104 and the adhesion layer 106 may be accomplished after the encapsulation process.

Figure 12:
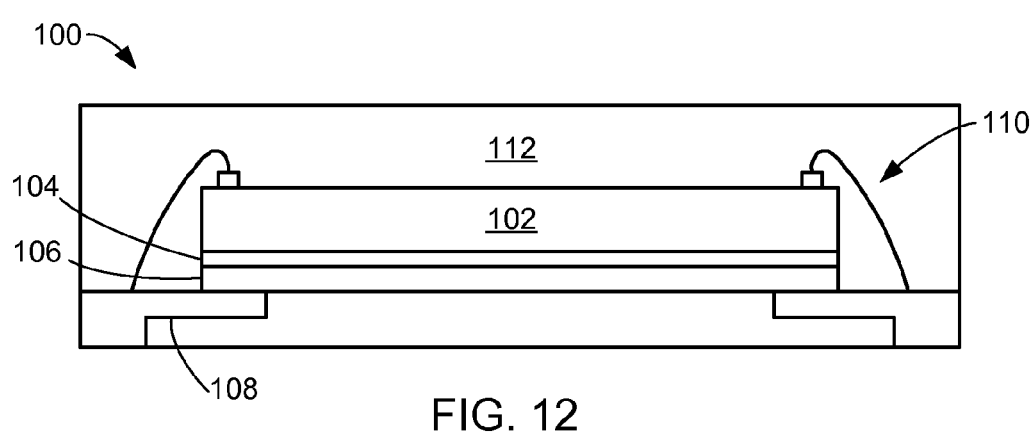
FIG. 12 is the structure of FIG. 11 after removal of the leadframe tape and singulation of the integrated circuit package system.

Referring now to FIG. 12, therein is shown the structure of FIG. 11 after removal of the leadframe tape 800 of FIG. 11 and singulation into the integrated circuit package system 100.

Figure 13:
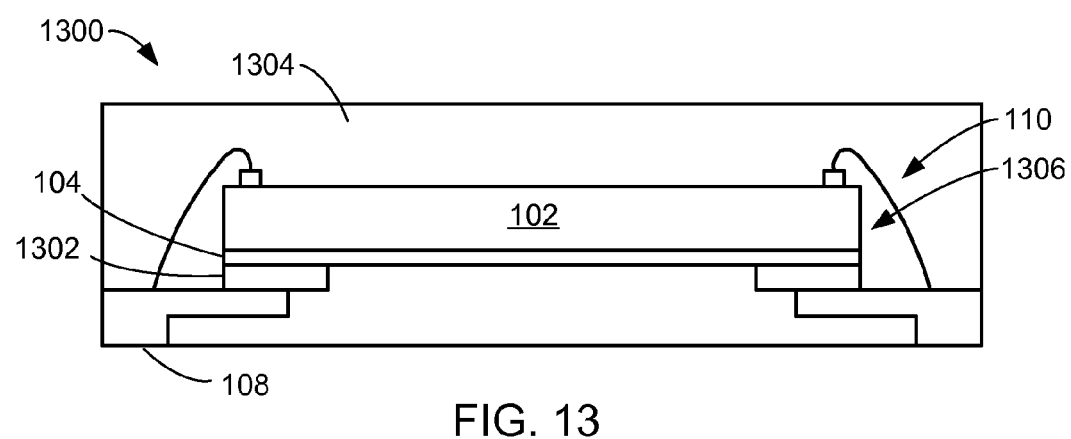
FIG. 13 is a cross-sectional view of an integrated circuit package system in a second embodiment of the present invention.

Referring now to FIG. 13, therein is shown a cross-sectional view of an integrated circuit package system 1300 in a second embodiment of the present invention. The integrated circuit package system 1300 includes the semiconductor chip 102 over the leadfingers 108.

The semiconductor chip 102 has the stress-relieving layer 104 and adhesion layer portions 1302 of the adhesion layer 106, which are adjacent the diced sides 1306 of the semiconductor chip 102. The adhesion layer portions 1302 are selectively formed on the stress-relieving layer 104 just over the leadfingers 108 in such a manner as to avoid wafer warping by providing minimal material for CTE mismatch to occur.

The semiconductor chip 102 is connected to the leadfingers 108 by bond wires 110 and is encapsulated in an encapsulant 1304.

Figure 14:
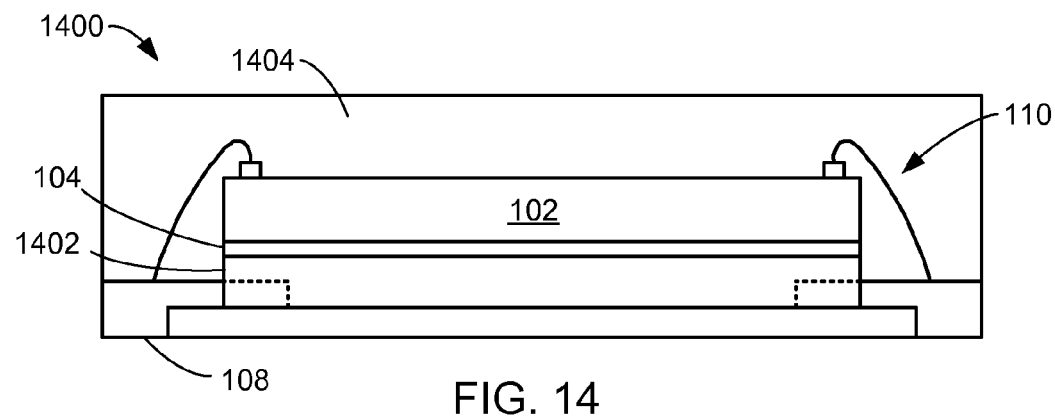
FIG. 14 is a cross-sectional view of an integrated circuit package system in a third embodiment of the present invention.

Referring now to FIG. 14, therein is shown a cross-sectional view of an integrated circuit package system 1400 in a third embodiment of the present invention. The integrated circuit package system 1400 includes the semiconductor chip 102 and the stress-relieving layer 104.

Under the stress-relieving layer 104 is an extra thick adhesion layer 1402. The adhesion layer 1402 is thick enough to form over the sides of the leadfingers 108. The adhesion layer 1402, in addition to bonding to the top of the leadfingers 108, also bonds on the sides of the leadfingers 108 to effectively cover the leadfingers 108. This provides a lead-locking function for the leadfingers and eliminates the problem of bouncing leadfingers during wire bonding.

The semiconductor chip 102 is wire bonded by bond wires 110 to the leadfingers 108 and the structure is encapsulated in an encapsulant 1404.

Figure 15:
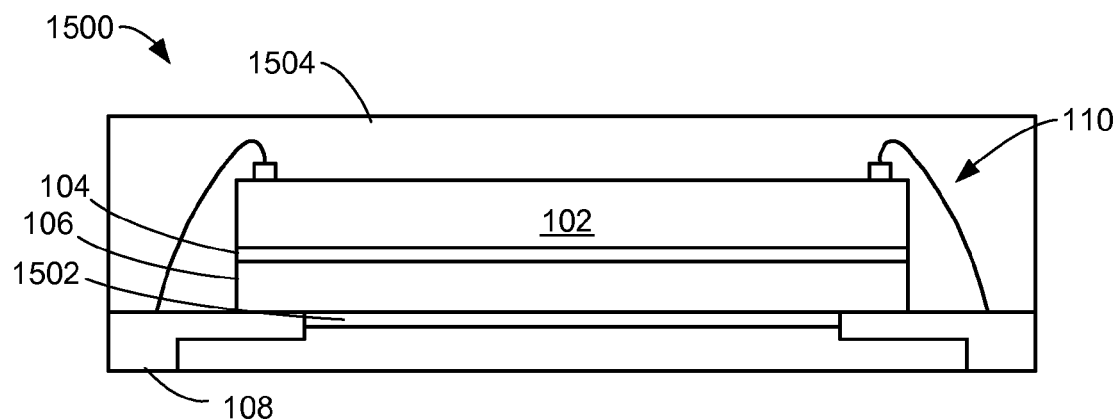
FIG. 15 is a cross-sectional view of an integrated circuit package system in a fourth embodiment of the present invention.

Referring now to FIG. 15, therein is shown a cross-sectional view of an integrated circuit package system 1500 in a fourth embodiment of the present invention. The integrated circuit package system 1500 includes the semiconductor chip 102, the stress-relieving layer 104, and the adhesion layer 106.

Under the adhesion layer 106 is an additional stress-relieving layer 1502. The additional stress-relieving layer 1502 is between and in direct contact with the leadfingers 108. The additional stress-relieving layer 1502 helps to further eliminate wafer warping.

The semiconductor chip 102 is wire bonded by bond wires 110 to the leadfingers 108 and the structure is encapsulated in an encapsulant 1504.

Figure 16:
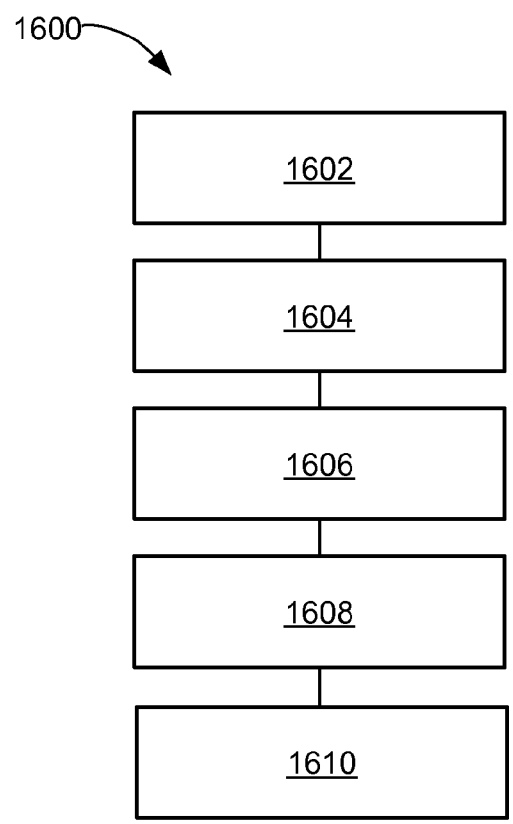
FIG. 16 is a flow chart for an integrated circuit package system for manufacturing the integrated circuit package system.

Referring now to FIG. 16, therein is shown a flow chart for an integrated circuit package system 1600 for manufacturing the integrated circuit package system 100. The integrated circuit package system 1600 includes providing an integrated circuit wafer having an active side and a backside in a block 1602; forming a stress-relieving layer on the backside in a block 1604; forming an adhesion layer on the stress-relieving layer in a block 1606; dicing the integrated circuit wafer into a semiconductor chip with the stress-relieving layer and the adhesion layer on the backside of the semiconductor chip in a block 1608; and mounting the semiconductor chip over leadfingers in a block 1610.

Thus, it has been discovered that the integrated circuit package system method and apparatus of the present invention furnish important and heretofore unknown and unavailable solutions, capabilities, and functional aspects. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations, which fall within the scope of the included claims. All matters hithertofore set forth herein or shown in the accompanying drawings are to be interpreted in an illustrative and non-limiting sense.

What is claimed is:

1. An integrated circuit package system comprising:
a semiconductor chip;
a stress-relieving layer on the semiconductor chip;
an adhesion layer on the stress relieving layer;
electrical interconnects bonded to the adhesion layer; and
an additional stress-relieving layer on the adhesion layer and attached between the electrical interconnects.

2. The system as claimed in claim 1 wherein:
the adhesion layer is on selected regions of the stress-relieving layer adjacent the diced sides of the semiconductor chip; and
the semiconductor chip is mounted by the adhesion layer on the electrical interconnects.

3. The system as claimed in claim 1 wherein:
the adhesion layer is thicker than the stress-relieving layer; and
the adhesion layer on the electrical interconnects and over the sides thereof.

4. The system as claimed in claim 1 wherein:
the additional stress-relieving layer holds the semiconductor chip over the electrical interconnects.

5. The system as claimed in claim 1 further comprising:
bond wires electrically connecting the semiconductor chip to the electrical interconnects; and
an encapsulant encapsulating the semiconductor chip, the bond wires, and the electrical interconnects.

6. The system as claimed in claim 1 wherein:
the stress-relieving layer is a low modulus stress-relieving layer;
the adhesion layer is a high modulus adhesion layer;
the low modulus stress-relieving layer and the high modulus adhesion layer are fully cured; and
the electrical interconnects are leadfingers.

7. The system as claimed in claim 6 wherein:
the high modulus adhesion layer is on selected regions of the low modulus stress-relieving layer adjacent the diced sides of the semiconductor chip; and
the semiconductor chip is mounted by the high modulus adhesion layer on the leadfingers.

8. The system as claimed in claim 6 wherein:
the high modulus adhesion layer is thicker than the low modulus stress-relieving layer; and
the high modulus adhesion layer on the leadfingers and over the sides thereof.

9. The system as claimed in claim 6 wherein:
the additional stress-relieving layer holds the semiconductor chip on the leadfingers.

10. The system as claimed in claim 6 further comprising:
bond wires electrically connecting the semiconductor chip to the leadfingers; and
an encapsulant encapsulating the semiconductor chip, the bond wires, and the leadfingers.

* * * * *